(12) United States Patent
Lee

(10) Patent No.: US 9,985,172 B2
(45) Date of Patent: May 29, 2018

(54) LIGHT EMITTING DEVICE

(71) Applicant: LG INNOTEK CO., LTD., Seoul (KR)

(72) Inventor: Dae Hee Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days. days.

(21) Appl. No.: 15/322,045

(22) PCT Filed: Jun. 22, 2015

(86) PCT No.: PCT/KR2015/006273
§ 371 (c)(1),
(2) Date: Dec. 23, 2016

(87) PCT Pub. No.: WO2015/199388
PCT Pub. Date: Dec. 30, 2015

(65) Prior Publication Data
US 2017/0148946 A1 May 25, 2017

(30) Foreign Application Priority Data

Jun. 27, 2014 (KR) ........................ 10-2014-0079454

(51) Int. Cl.
*H01L 33/04* (2010.01)
*H01L 33/62* (2010.01)
(Continued)

(52) U.S. Cl.
CPC ............ *H01L 33/04* (2013.01); *H01L 33/025* (2013.01); *H01L 33/22* (2013.01); *H01L 33/32* (2013.01); *H01L 33/46* (2013.01); *H01L 33/62* (2013.01)

(58) Field of Classification Search
CPC ......... H01L 33/04; H01L 33/22; H01L 33/62; H01L 33/025; H01L 33/32; H01L 33/46;
(Continued)

(56) References Cited

U.S. PATENT DOCUMENTS

2005/0104077 A1* 5/2005 Song ...................... H01L 33/42
257/94
2005/0258436 A1 11/2005 Arai
(Continued)

FOREIGN PATENT DOCUMENTS

EP 2790223 A2 10/2014
JP 2005-332773 A 12/2005
(Continued)

*Primary Examiner* — Natalia Gondarenko
(74) *Attorney, Agent, or Firm* — Birch, Stewart, Kolasch & Birch, LLP

(57) ABSTRACT

In one embodiment, a light emitting device comprises a first light emitting part including at least one light emitting cell; a second light emitting part including a plurality of light emitting cells, wherein each of the light emitting cells include a light emitting structure and a first electrode layer disposed under the light emitting structure; a plurality of pads disposed on the light emitting cell of the first light emitting part, wherein the pads are electrically connected to each of the light emitting cells of the first and second light emitting parts; a plurality of connection layers, each connection layer extending from a region under the light emitting cell of the first light emitting part to a region under the plurality of light emitting cells of the second light emitting part; a second electrode layer disposed under the light emitting cells of the first and second light emitting parts; an insulating layer disposed between the first and second electrode layers; and at least one gap part disposed between the at least one light emitting cell of the first light emitting part and the plurality of light emitting cells of the second light emitting part, wherein each of the plurality of connection layers extends through a region under the gap part and is electrically connected to each of the plurality of the light emitting cells of the second light emitting part.

20 Claims, 7 Drawing Sheets

(51) Int. Cl.
*H01L 33/36* (2010.01)
*H01L 33/08* (2010.01)
*H01L 33/22* (2010.01)
*H01L 33/46* (2010.01)
*H01L 33/32* (2010.01)
*H01L 33/02* (2010.01)

(58) Field of Classification Search
CPC .......... H01L 33/48–33/648; H01L 2933/0016; H01L 2933/0033; H01L 2933/005; H01L 2933/0066–2933/0091; H01L 2224/8319–2224/83194; H01L 25/00; H01L 25/167
USPC ......... 257/15, 91, 93, 98, 99, 737, 739, 774, 257/778, 88; 438/26–29, 34
See application file for complete search history.

(56) References Cited

U.S. PATENT DOCUMENTS

| | | | |
|---|---|---|---|
| 2010/0078656 A1* | 4/2010 | Seo | H01L 27/156 257/88 |
| 2011/0049537 A1* | 3/2011 | Lee | H01L 25/0753 257/88 |
| 2011/0241031 A1 | 10/2011 | Von Malm et al. | |
| 2012/0086026 A1 | 4/2012 | Engl et al. | |
| 2012/0161184 A1 | 6/2012 | Ubahara et al. | |
| 2012/0182738 A1 | 7/2012 | Jeong | |
| 2013/0105828 A1 | 5/2013 | Kim et al. | |
| 2013/0240927 A1* | 9/2013 | Nunotani | H01L 33/0079 257/98 |
| 2014/0131657 A1 | 5/2014 | Kim et al. | |
| 2014/0306247 A1 | 10/2014 | Lee | |

FOREIGN PATENT DOCUMENTS

| | | |
|---|---|---|
| JP | 2011-170290 A | 9/2011 |
| JP | 2014-96591 A | 5/2014 |
| KR | 10-2010-0126733 A | 12/2010 |
| KR | 10-2013-0025232 A | 3/2013 |
| KR | 10-2013-0029543 A | 3/2013 |
| KR | 10-2013-0046755 A | 5/2013 |
| KR | 10-2013-0067148 A | 6/2013 |

* cited by examiner

[FIG. 1]
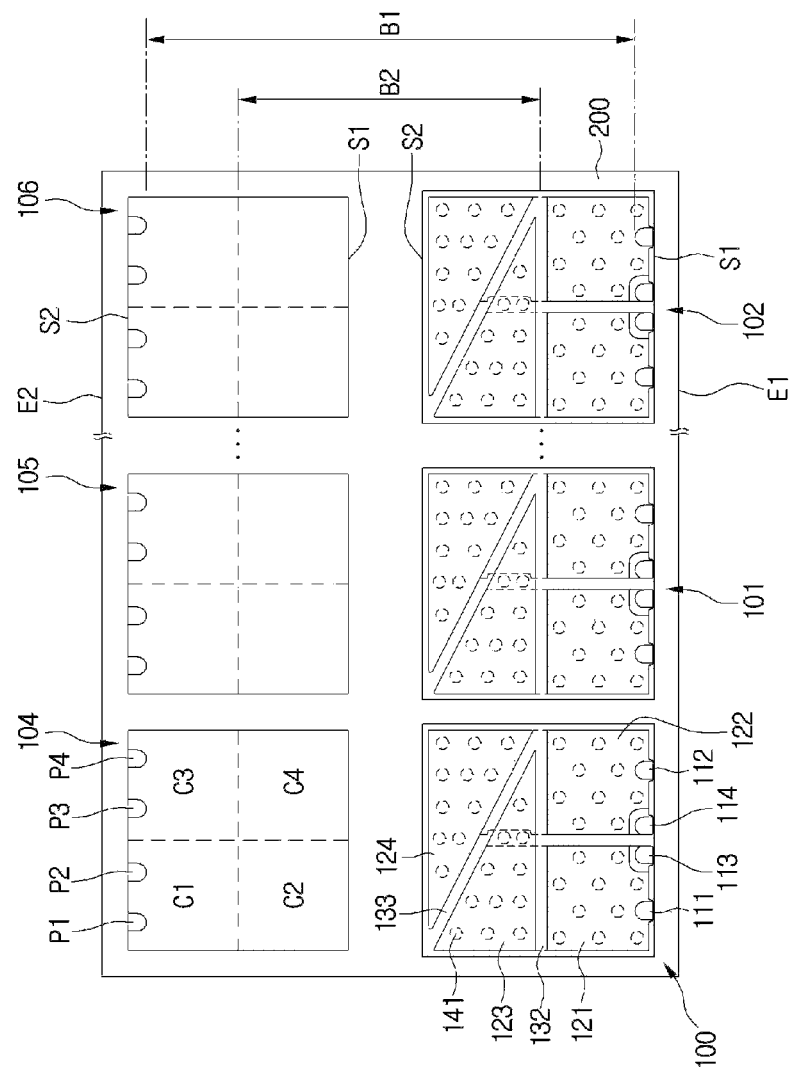

[FIG. 2]
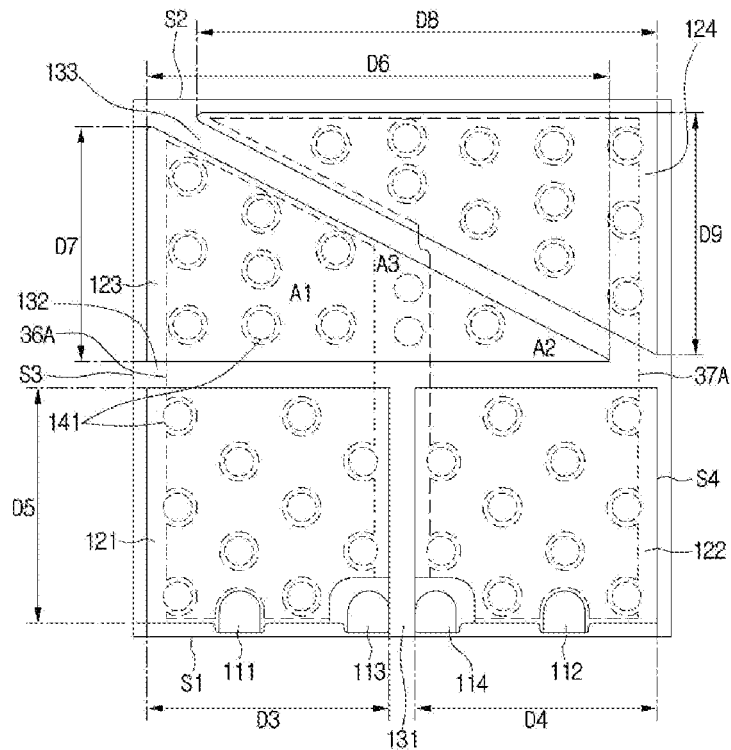
[FIG. 3]
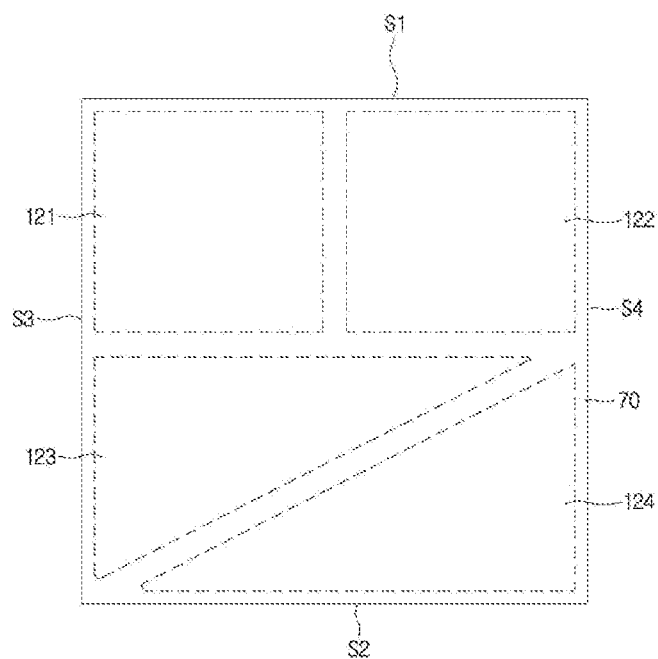

[FIG. 4]
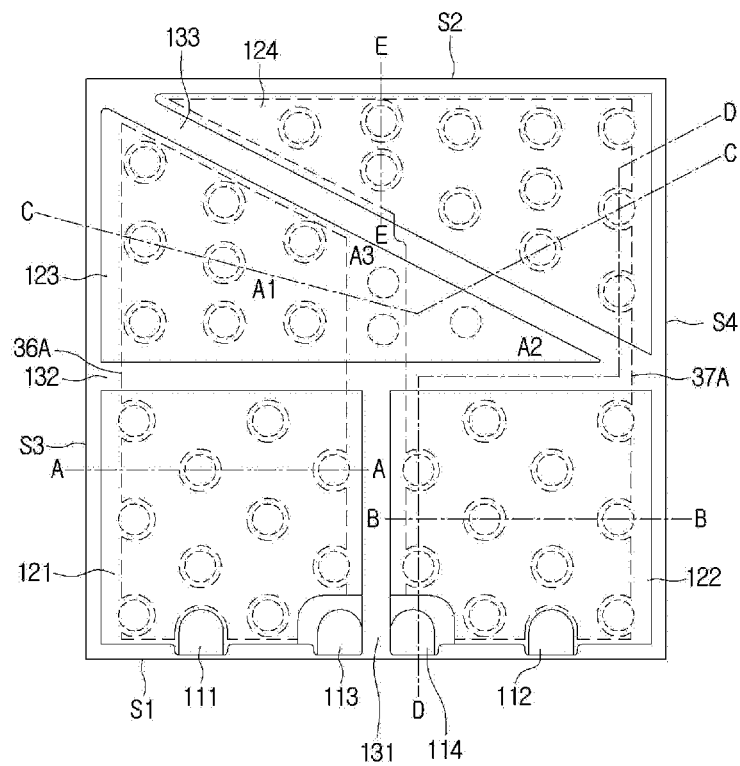
[FIG. 5]
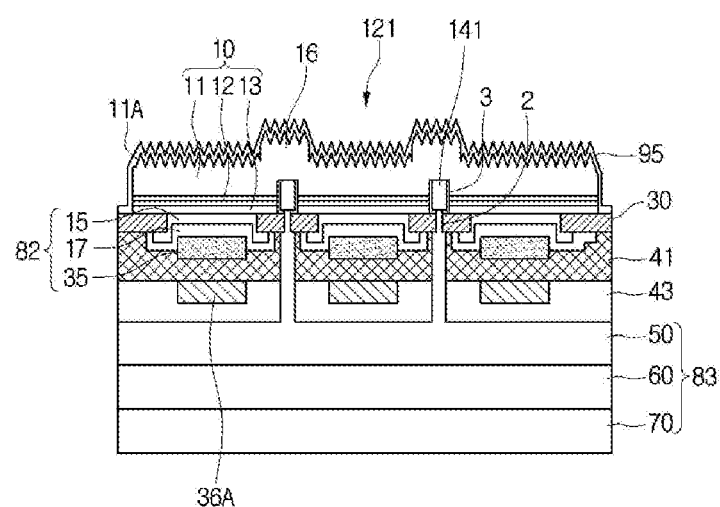

[FIG. 6]
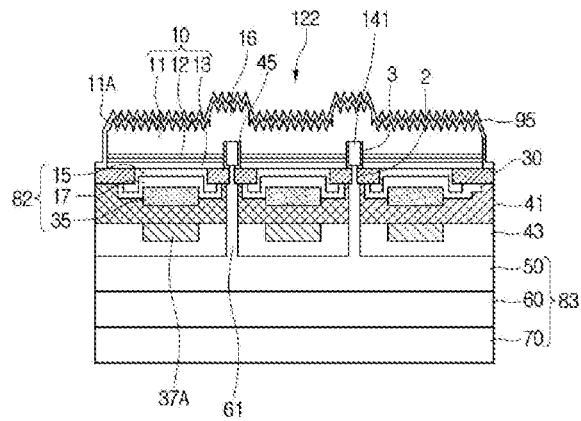
[FIG. 7]
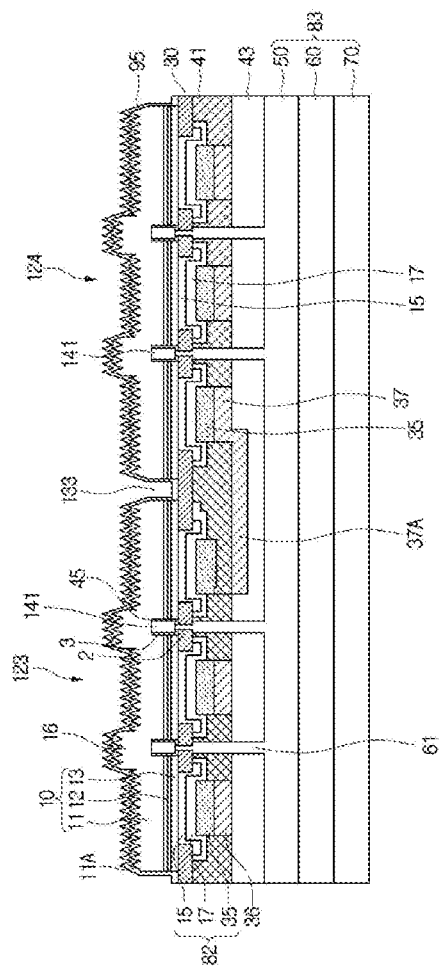

[FIG. 9]
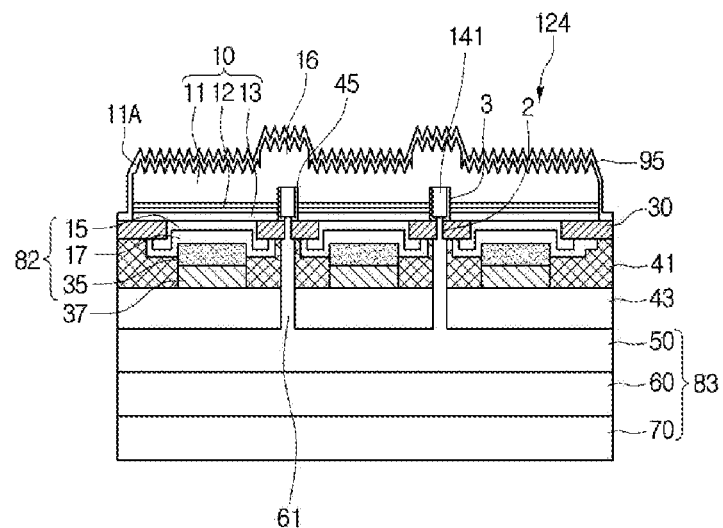
[FIG. 10]
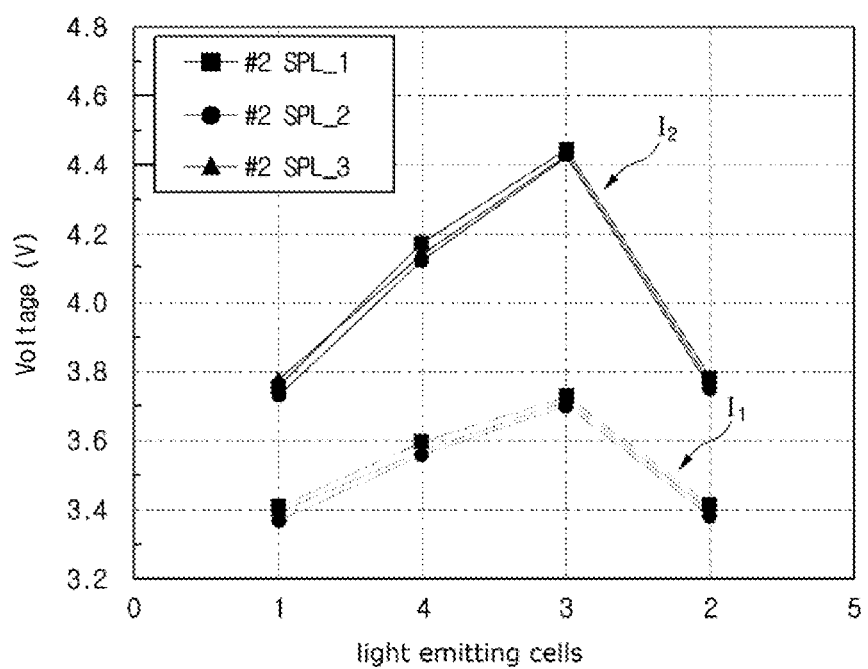

[FIG. 11]
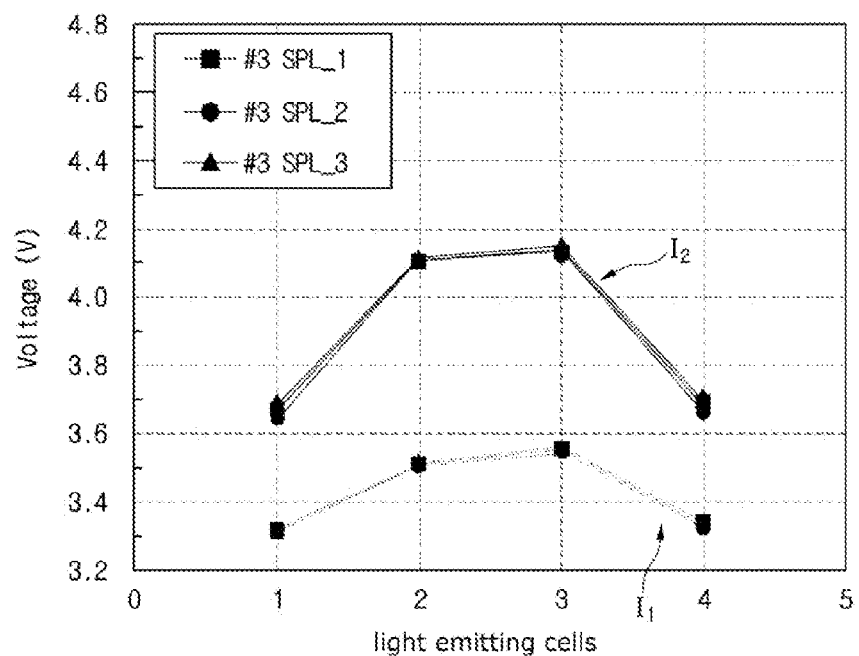

LIGHT EMITTING DEVICE

CROSS REFERENCE TO RELATED APPLICATIONS

This application is the National Phase of PCT International Application No. PCT/KR2015/006273, filed on Jun. 22, 2015, which claims priority under 35 U.S.C. 119(a) to Patent Application No. 10-2014-0079454, filed in Republic of Korea on Jun. 27, 2014, all of which are hereby expressly incorporated by reference into the present application.

BACKGROUND

Field of the Present Disclosure

Embodiments relate to a light emitting device and a lighting unit including the same.

Discussion of Related Art

As one type of a light emitting device, LEDs (Light Emitting Diodes) have been widely employed. The LED may function to convert an electrical signal to a light such as infrared, visible, and ultraviolet rays using properties of a compound semiconductor.

As light efficiency of the light emitting device increases, the light emitting device has a variety of applications such as a display device, an illustration device, etc.

SUMMARY

An embodiment is to provide a light emitting device having a plurality of light emitting cells.

An embodiment is to provide a light emitting device having a conductive support disposed under and commonly electrically connected to the plurality of light emitting cells, and a plurality of pads for driving the plurality of light emitting cells, respectively.

An embodiment is to provide a light emitting device to allow a reduction of a difference between operation voltages of at least two light emitting cells due to a difference between distances between the at least two light emitting cells and pads.

An embodiment is to provide a lighting unit having the light emitting device.

An embodiment provides a light emitting device comprising: a first light emitting part including at least one light emitting cell; a second light emitting part including a plurality of light emitting cells, wherein each of the light emitting cells include a light emitting structure and a first electrode layer disposed under the light emitting structure; a plurality of pads disposed on the light emitting cell of the first light emitting part, wherein the pads are electrically connected to each of the light emitting cells of the first and second light emitting parts; a plurality of connection layers, each connection layer extending from a region under the light emitting cell of the first light emitting part to a region under the plurality of light emitting cells of the second light emitting part; a second electrode layer disposed under the light emitting cells of the first and second light emitting parts; an insulating layer disposed between the first and second electrode layers; and at least one gap part disposed between the at least one light emitting cell of the first light emitting part and the plurality of light emitting cells of the second light emitting part, wherein each of the plurality of connection layers extends through a region under the gap part and is electrically connected to each of the plurality of the light emitting cells of the second light emitting part.

An embodiment provides a light emitting device comprising: a first light emitting part including first and second light emitting cells; a second light emitting part including third and fourth light emitting cells; a plurality of pads disposed on the first and second light emitting cells and electrically connected to the first to fourth light emitting cells respectively; an insulating layer disposed under the first to fourth light emitting cells; a bonding layer disposed under the insulating layer; a diffusion inhibition layer disposed under the bonding layer; a conductive support disposed under the diffusion inhibition layer; a first capping layer disposed between the insulating layer and each of the first to fourth light emitting cells; a second capping layer disposed between the insulating layer and the bonding layer in each of the third and fourth light emitting cells; a first connection layer disposed under the first and third light emitting cells and electrically connected to the first capping layer; and a second connection layer disposed under the second and fourth light emitting cells and electrically connected to the second capping layer, wherein each of the first to fourth light emitting cells includes a first semiconductor layer, an active layer disposed under the first semiconductor layer, and a second semiconductor layer disposed under the active layer, wherein the first semiconductor layer is electrically connected to the bonding layer, wherein the second semiconductor layer is electrically connected to the first capping layer, wherein the third light emitting cell is disposed between the first and second light emitting cells and the fourth light emitting cell, wherein a length of the fourth light emitting cell gradually increased at it becomes further away from the pads, wherein the third and fourth light emitting cells have different distances from the plurality of pads, wherein a width of the first connection layer in a region between the first light emitting cell and third light emitting cell is equal to a width of the second connection layer in a region between the second light emitting cell and third light emitting cell.

In accordance with the present disclosure, there may be achieved a reduction of a difference between operation voltages of at least two light emitting cells due to a difference between distances between the at least two light emitting cells and pads.

In accordance with the present disclosure, there may be achieved a reduction of a difference between optical properties of the light emitting cells in the light emitting part.

In accordance with the present disclosure, there may be achieved a reliability of the light emitting device, and a light emitting device package including the same and a lighting unit including the same.

BRIEF DESCRIPTION OF THE DRAWINGS

FIG. 1 is a top view of a lighting unit including a plurality of light emitting devices in accordance with one embodiment.

FIG. 2 is a top view of a first light emitting device in FIG. 1.

FIG. 3 is a bottom view of a first light emitting device in FIG. 2.

FIG. 4 is a top view of a first light emitting device in FIG. 1.

FIG. 5 is a cross-sectional view of a first light emitting device taken in a line A-A in FIG. 4.

FIG. 6 is a cross-sectional view of a first light emitting device taken in a line B-B in FIG. 4.

FIG. 7 is a cross-sectional view of a first light emitting device taken in a line C-C in FIG. 4.

FIG. 9 is a cross-sectional view of a first light emitting device taken in a line E-E in FIG. 4.

FIG. 10 illustrates an example of differences between the operation voltages of light emitting cells of a light emitting device in a conventional approach.

FIG. 11 illustrates an example of differences between the operation voltages of light emitting cells of a light emitting device in a present approach.

DETAILED DESCRIPTIONS

Figure 8:
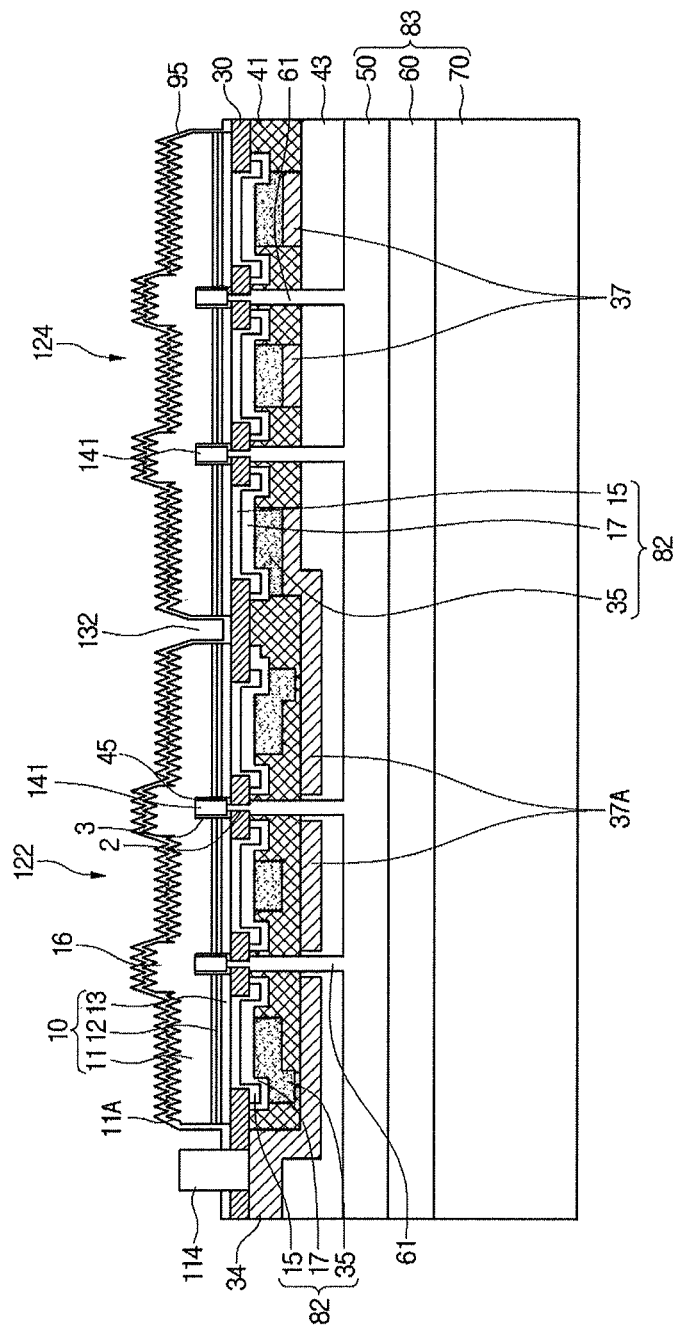
FIG. 8 is a cross-sectional view of a first light emitting device taken in a line D-D in FIG. 4.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present. Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below.

Hereinafter, a light emitting device, a light emitting device package, a lighting unit and a method for manufacturing the light emitting device in accordance with various embodiments will be described in details with reference to the accompanying drawings.

FIG. 1 is a top view of a lighting unit including a plurality of light emitting devices in accordance with one embodiment. FIG. 2 is a top view of a first light emitting device in FIG. 1. FIG. 3 is a bottom view of a first light emitting device in FIG. 2.

Referring to FIG. 1, the lighting unit may include a plurality of light emitting device 100, 101, 102, 104, 105 and 106. The plurality of light emitting devices 100, 101, 102, 104, 105 and 106 may form at least one row or at least one column. The plurality of light emitting devices 100, 101, 102, 104, 105 and 106 may form at least one row and column. The plurality of light emitting devices 100, 101, 102, 104, 105 and 106 may form, for example, a matrix. For example, the plurality of light emitting devices 100, 101, 102, 104, 105 and 106 may form at least 2*2 matrix. Although the embodiment illustrates the plurality of light emitting devices 100, 101, 102, 104, 105 and 106 may form at least 2*3 matrix, the present disclosure is not limited thereto. More or less columns and rows may form a matrix.

The at least two rows may include a lower first row and an upper second row. The first row may include a plurality of first light emitting devices 100, 101 and 102 spaced apart from each other in a row. The second row may include a plurality of second light emitting devices 104, 105 and 106 spaced apart from each other in a row. The plurality of first light emitting devices 100, 101, and 102 may position-correspond to the plurality of second light emitting devices 104, 105 and 106 respectively. Alternatively, the plurality of first light emitting devices 100, 101, and 102 may be position-alternated with the plurality of second light emitting devices 104, 105 and 106 respectively. However, the present disclosure is not limited thereto.

The first or/and second light emitting devices 100, 101, 102, 104, 105 and 106 may be individually driven or may be driven on a column or/and row basis. However, the present disclosure is not limited thereto. For example, the light emitting devices 100, 101, 103, 104, 105 and 106 may be connected in a parallel manner with each other, and may be selectively driven.

Each of the first light emitting devices 100, 101, and 102 may include a plurality of light emitting cells 121, 122, 123 and 124. Among the plurality of light emitting cells 121, 122, 123 and 124, at least one cell may have different shape or length from remaining light emitting cells. For example, among the plurality of light emitting cells 121, 122, 123 and 124, each of the light emitting cells 123 and 124 may have a horizontal length larger than that of each of the light emitting cells 121, 122. Each of the second light emitting devices 104, 105 and 106 may include a plurality of light emitting cells C1-C4. Among the plurality of light emitting cells C1, C2, C3, C4, at least one cell may have the same as or different size as those of remaining cells. However, the present disclosure is not limited thereto.

Each of the first light emitting devices 100, 101, 102 may include at least two, for example, at least four light emitting cells. For example, each of the first light emitting devices 100, 101, 102 may include first to fourth light emitting cells 121, 122, 123 and 124. Each of the second light emitting devices 104, 105 and 106 may include at least two, for example, at least four light emitting cells, for example, fifth to eighth light emitting cells C1, C2, C3, C4. A number of light emitting cells of each of the first light emitting devices 100, 101, and 102 may be different from or the same as that of light emitting cells of each of the second light emitting device 104, 105 and 106. However, the present disclosure is not limited thereto.

As shown in FIG. 2, the first light emitting device 100, 101, 102 may include first and second light emitting cells 121 and 122 adjacent to a first side S1, and third and fourth light emitting cells 123 and 124 adjacent to a second side S2 opposite the first side S1. The first and second side may be horizontal. The fourth light emitting cell 124 may be closer to the second side S2 than the third light emitting cell 123. Further, the lighting unit may have third and fourth sides S3, S4 perpendicular to the first and second side S1 and S2. The third and fourth sides S3, S4 may be opposite to each other. The third light emitting cell 123 may be closer to the third side S3 than the fourth light emitting cell 124. The fourth light emitting cell 124 may be closer to the fourth side S4 than the third light emitting cell 123.

Each of the first and second light emitting cells 121 and 122 may have a top view shape such as a polygonal shape, for example, a rectangular shape. Each of the third and fourth light emitting cells 123 and 124 may have a top view shape such as a polygonal shape or a different shape from that of each of the first and second light emitting cells 121 and 122. Each of the third and fourth light emitting cells 123 and 124 may have a triangular shape, for example, a right angled triangular shape. The third light emitting cell 123 may be disposed between the first and second light emitting cells 121 and 122 and fourth light emitting cell 124. The third light emitting cells 123 may have a width D7 adjacent to the third side S3 and may taper from the third side S3 to the fourth side S4.

A side of the fourth light emitting cell 124 may correspond a long side or a hypotenuse of a sides of the third light emitting cell 123. The fourth light emitting cell 124 may have the greatest wider width D9 at a region adjacent to the fourth side S4 and may have a smaller width as it becomes closer to the third side S3. The third light emitting cell 123 and the fourth light emitting cell 124 may have different distances from pads 111, 112, 113 and 114. The third light emitting cell 123 may have a horizontal length which gradually decreases as it goes further away from the pads 111, 112, 113 and 114. The third light emitting cell 123 may be disposed between the fourth light emitting cell 124 and the first and second light emitting cells 121 and 122. The fourth light emitting cell 124 may have a horizontal length which gradually increases as it goes further away from the pads 111, 112, 113 and 114.

The first and second light emitting cells 121 and 122 may be disposed to be symmetrical horizontally. The third and fourth light emitting cells 123 and 124 may be disposed to have a symmetry of rotation with each other. The forms of the first to fourth light emitting cells 121, 122, 123, and 124 may not be limited thereto. For example, the first to fourth light emitting cells 121, 122, 123, and 124 may have a circular or elliptical shape.

As shown FIG. 1, the fifth to eighth light emitting cells C1, C2, C3, C4 of each of the second light emitting device 104, 105 and 106 may have the same top view shape, for example, a polygonal shape, for example, a rectangular shape. However, the present disclosure may not be limited thereto. For example, each of the fifth to eighth light emitting cells C1, C2, C3, C4 may have a circular or elliptical shape. The fifth and sixth light emitting cells C1 and C2 may be disposed to be symmetrical horizontally. The seventh and eighth light emitting cells C3 and C4 may be disposed to be symmetrical horizontally. However, the present disclosure is not limited thereto. The fifth and sixth light emitting cells C1 and C2 may be disposed to have a symmetry of rotation with each other. The seventh and eighth light emitting cells C3 and C4 may be disposed to have a symmetry of rotation with each other.

The first to fourth light emitting cells 121, 122, 123 and 124 of each of the first light emitting devices 100, 101, 102 may be connected to a plurality of pads 111, 112, 113 and 114 respectively. The plurality of pads 111, 112, 113 and 114 may be disposed on or adjacent to at least one or two light emitting cells. On the fifth and sixth light emitting cells C1, C2, at least one pad, for example, the plurality of pads P1, P2, P3, P4 may be disposed. The plurality of pads P1, P2, P3, P4 may be electrically connected to the fifth to eighth light emitting cells C1, C2, C3, and C4, respectively. The fifth to eighth light emitting cells C1, C2, C3, and C4 may be connected to an underlying common electrode layer as a conductive support.

Referring to FIG. 1, each of the first light emitting devices 100, 101, 102 may include the first to fourth pads 111, 112, 113 and 114 connected to the first to fourth light emitting cells 121, 122, 123 and 124, respectively. Each of the second light emitting devices 104, 105 and 106 may include the fifth to eighth pads P1, P2, P3, P4 connected to the fifth to eighth light emitting cells C1, C2, C3, C4, respectively. The spacing B1 between the first to fourth pads 111, 112, 113 and 114 of each of the first light emitting device 100, 101, 102 and the fifth to eighth pads P1, P2, P3, P4 of each of the second light emitting devices 104, 105 and 106 may be larger than a spacing B2 between the second light emitting cells 12 and fifth light emitting cell C1.

The first light emitting devices 100, 101, 102 may be adjacent to a first side E1 of a board 200. The first to fourth pads 111, 112, 113 and 114 connected to each of the first light emitting devices 100, 101, 102 may be closer to the first side E1 than to a center of the board 200. The first side E1 may be adjacent to the first side S1 of each of the first light emitting devices 100, 101, 102.

The second light emitting devices 104, 105 and 106 may be adjacent to a second side E2 of the board 200. The fifth to eighth pads P1, P2, P3, P4 of each of the second light emitting devices 104, 105 and 106 may be closer to the second side E2 than to the center of the board 200. The second side E2 may be adjacent to the second side S2 of each of the second light emitting devices 104, 105 and 106.

The first to fourth pads 111, 112, 113 and 114 of each of the first light emitting device 100, 101, 102 may be adjacent to the first side E1 of the board 200. The fifth to eighth pads P1, P2, P3, P4 of each of the second light emitting devices 104, 105 and 106 may be adjacent to the second side E2 of the board 200. The first side E1 of the board 200 may be opposite to the second side E2 thereof.

As shown in FIG. 2, on the first light emitting cell 121, a plurality of pads, for example, the first and third pads 111, 113 connected respectively to the first and third light emitting cells 121, 123 may be disposed. On the second light emitting cells 122, a plurality of pads, for example, the second and fourth pads 112, 114 connected respectively to the second and fourth light emitting cells 122, 124 may be disposed. A distance between the first and third pads 111, 113 may be smaller than the width D5 of the first light emitting cell 121. A distance between the second and fourth pads 112, 114 may be smaller than the D5 of the first light emitting cell 121. A distance between the first and fourth pads 111, 114 may be smaller than a length D6 of the third light emitting cell 123 or a length D8 of the fourth light emitting cell 124.

When driving the lighting unit, the first column or/and second row of the light emitting cells may be driven. In an alternative, all of the light emitting cells in the first row and some of the light emitting cells in the second row may be driven. In an alternative, some of the light emitting cells in the first row and all of the light emitting cells in the second row may be driven. For example, the fifth to eighth light emitting cells C1, C2, C3, C4 of each of the second light emitting device 104, 105 and 106 and the fourth light emitting cell 124 each of the first light emitting devices 100, 101, 102 may be driven, thereby to achieve a high beam mode for a vehicle. In an alternative, the fourth light emitting cell 124 may be driven together with the fifth to eighth light emitting cells C1, C2, C3, C4 of each of the second light emitting device 104, 105 and 106, thereby to improve a luminous intensity in an upper region of the lighting unit. In another example, the fifth to eighth light emitting cells C1, C2, C3, C4 and the third and fourth light emitting cells 123 and 124 may be driven. In another example, only the first to fourth light emitting cells 121, 122, 123 and 124 may be driven. In another example, all of the light emitting cells may be driven. However, the present disclosure may not be limited thereto. The number and combination of the light emitting cells to be driven may depend on the applications of the present lighting unit.

Hereinafter, a first light emitting device 100 among the plurality of the first light emitting device 100, 101, 102 may be illustrated by way of example. Referring to FIG. 2 to FIG. 4, the first and third pads 111, 113 may be disposed on the first light emitting cell 121, while the second and fourth pads 112, 114 may be disposed on the second light emitting cell 122.

The first pad 111 may be electrically connected to the first light emitting cell 121, and the third pad 113 may be electrically connected to the third light emitting cell 123. The second pad 112 may be electrically connected to the second light emitting cell 122, and the fourth pad 114 may be electrically connected to the fourth light emitting cell 124. In each region of the first to fourth light emitting cells 121, 122, 123 and 124, a second contact layer 141 may be formed. The second contact layer 141 may be disposed to be embedded in each of the first to fourth light emitting cells 121, 122, 123 and 124. The second contact layer 141 may be electrically connected to each of the first to fourth light emitting cells 121, 122, 123 and 124.

The first light emitting device 100 may include gap parts 131, 132, 133 between the first to fourth light emitting cells 121, 122, 123 and 124 respectively. The first gap part 131 may be disposed between the first and second light emitting cells 121 and 122. The second gap part 132 may be disposed between the third light emitting cell 123 and the first and second light emitting cells 121 and 122. The third gap part 133 may be disposed between the third and fourth light emitting cells 123 and 124. The second gap part 132 may be connected to the first gap part 131 at the boundary between the first and second light emitting cells 121 and 122, and may be connected to third gap part 133 at the boundary between the second and fourth light emitting cells 122, 124.

The first and second light emitting cells 121 and 122 may have lengths D3 and D4 respectively smaller than the lengths D6, D8 of the third and fourth light emitting cells 123 and 124 respectively. Each of the first and second light emitting cells 121 and 122 may have the width D5 equal to the widths D7 and D9 of the third and fourth light emitting cells 123 and 124 respectively. However, the present disclosure is not limited thereto. In this connection, because the lengths D6, D8 of the third and fourth light emitting cells 123 and 124 respectively are larger than the lengths D3, D4 of the first and second light emitting cells 121 and 122 respectively, a horizontal or length-wise light distribution of the first light emitting device 100 may be effectively improved.

As shown in FIG. 4, under the first light emitting cell 121, a first connection layer 36A may be disposed. The first connection layer 36A may extend across and under the second gap part 132 and, then, across and under the third light emitting cell 123. The first connection layer 36A may connect the third pad 113 and the third light emitting cell 123. The first connection layer 36A may be partially disposed under the third pad 113.

Under the second light emitting cell 122, a second connection layer 37A may be disposed. The second connection layer 37A may extend across and under the second gap part 132 and across and under the third light emitting cell 123 and, then, under the fourth light emitting cell 124. The second connection layer 37A may connect the fourth pad 114 and fourth light emitting cell 124. The second connection layer 37A may be disposed under the fourth pad 114.

As shown in FIG. 2 and FIG. 4, the first and second connection layers 36A, 37A may be spaced from each other. A spacing between the first and second connection layers 36A, 37A may be smaller than a spacing between the first and second light emitting cells 121 and 122 or may be equal to the spacing between the first and second light emitting cells 121 and 122. The present disclosure is not limited thereto.

In this connection, a width of the first connection layer 36A in a first region under the second gap part 132 may be equal to or larger than a width of the first connection layer 36A in a second region under the first light emitting cell 121. A width of the first connection layer 36A in a first region under the second gap part 132 may be equal to a width of the first connection layer 36A in a region under the third light emitting cell 123.

Further, a width of the second connection layer 37A in a first region under the second gap part 132 may be equal to or larger than a width of the second connection layer 37A under the second light emitting cell 122. A width of the second connection layer 37A in a first region under the second gap part 132 may be equal to a width of the second connection layer 37A under the third light emitting cell 123.

A width of the second connection layer 37A in a first region under the second gap part 132 may be equal to a width of the first connection layer 36A under the second gap part 132. In this way, using the first and second connection layers 36A, 37A, an operation voltage difference between the third and fourth light emitting cells 123 and 124 may be reduced.

A width of the second connection layer 37A in a first region under the second gap part 132 may be equal to lengths D3 or D4 of the first light emitting cell 121 or second light emitting cell 122. In this way, using the first connection layer 36A and second connection layer 37A, an operation voltage difference between the light emitting cells may be reduced. Further, the width of the second connection layer 37A may be in a range of 80% to 100% of a width of the first connection layer 36A. For example, a smaller difference between the width of the second connection layer 37A and the width of the first connection layer 36A may lead to a further reduction of the difference between voltages supplied via the first connection layer 36A and second connection layer 37A respectively. When the width of the second connection layer 37A is under 80% of a width of the first connection layer 36A, the luminous intensity of the fourth light emitting cell 124 may be lower than that of the third light emitting cell 123. Further, when the fourth light emitting cell 124 may be driven together with the fifth to eighth light emitting cells C1, C2, C3, and C4, the fourth light emitting cell 124 may have the luminous intensity considerably lower than those of the fifth to eighth light emitting cells C1, C2, C3, and C4. When the width of the second connection layer 37A exceeds 100% of a width of the first connection layer 36A, a design change of the third light emitting cell 123 may be difficult.

In this way, a width of the second connection layer 37A under the third gap part 133 may be equal to the width of the first connection layer 36A under the second gap part 132. In an alternative, a width of the second connection layer 37A under the third gap part 133 may be in a range of 80% to 100% of the width of the first connection layer 36A under the second gap part 132. Without considerable reduction of the width of the second connection layer 37A, and with the second connection layer 37A being connected through a region under the third gap part 133 to the fourth light emitting cell 134, a difference between a voltage supplied via the second connection layer 37A and a voltage supplied via the first connection layer 36A may be reduced.

As shown in FIG. 3, under the first to fourth light emitting cells 121, 122, 123 and 124, a conductive support 70 may be disposed. The conductive support 70 may support the first to fourth light emitting cells 121, 122, 123 and 124. The conductive support 70 may act as a common electrode layer for the first and fourth light emitting cells 121, 122, 123 and 124.

FIG. 4 is a top view of a first light emitting device in FIG. 1. FIG. 5 is a cross-sectional view of a first light emitting device taken in a line A-A in FIG. 4. FIG. 6 is a cross-sectional view of a first light emitting device taken in a line B-B in FIG. 4. FIG. 7 is a cross-sectional view of a first light emitting device taken in a line C-C in FIG. 4. FIG. 8 is a cross-sectional view of a first light emitting device taken in a line D-D in FIG. 4. FIG. 9 is a cross-sectional view of a first light emitting device taken in a line E-E in FIG. 4.

Referring to FIG. 4 to FIG. 9, the light emitting device may include a light emitting structure 10 including a plurality of semiconductor layers, a protective layer 30 under the light emitting structure 10, a first electrode layer 82 under the light emitting structure 10, a second electrode layer 83 under the first electrode layer 82, first and second insulating layers 41, 43 between the first and second electrode layers 82, 83, a plurality of pads 111, 112, 113 and 114, a second contact layer 141, and a third insulating layer 45 around the second contact layer 141.

Each of the first to fourth light emitting cells 121, 122, 123 and 124 may include the light emitting structure 10, and at least one of the first electrode layer 82, the second contact layer 141, and the first and second insulating layers 41, 43. Each of the first to fourth light emitting cells 121, 122, 123 and 124 may be the light emitting structure 10, or may be a stack of the light emitting structure 10 and first electrode layer 82, or may include the light emitting structure 10, the first electrode layer 82, the second contact layer 141 and the insulating layers 41, 43. The light emitting structure 10 above the first and second insulating layer 41, 43 may be electrically connected to the second electrode layer 83. The light emitting structure 10 of each of the first to fourth light emitting cells 121, 122, 123 and 124 may be electrically connected to and between the first electrode layer 82 and second contact layer 141. The second contact layer 141 may be electrically connected to the second electrode layer 83.

A first row may include the first and second light emitting cells 121 and 122, and a second row may include the third and fourth light emitting cells 123 and 124. As shown in FIG. 5 and FIG. 6, in the first row, each of the first and second light emitting cells 121 and 122 may include a first capping layer 35. As shown in FIG. 8, in the second row, the third light emitting cell 123 may include a second capping layer 36. As shown in FIG. 7 and FIG. 9, in the second row, the fourth light emitting cell 124 may include a third capping layer 37. That is, the third light emitting cell 123 may include a plurality of capping layers 35, 36, and the fourth light emitting cell 124 may include a plurality of capping layers 35, 37. The light emitting cells in the first row or the first and second light emitting cells 121 and 122 may be defined as a first light emitting part. The light emitting cells in the second row or the third and fourth light emitting cells 123 and 124 may be defined as a second light emitting part.

In another example, the first row may include at least one light emitting cell, and the second row may include at least two light emitting cells, that is, a plurality of light emitting cells. Further, the plurality of connection layers may extend across and under the at least one light emitting cells of the first unit and the gap part between the first and second units, and, then, may extend across and under the plurality of light emitting cells of the second unit. In this connection, the plurality of pads may be disposed on the at least one light emitting cell of the first light emitting part. Each of the plurality of connection layers may extend across and under the at least one light emitting cells of the first unit and the gap part between the first and second units, and, then, may extend across and under the plurality of light emitting cells of the second unit and may be coupled to the plurality of light emitting cells of the second light emitting part. Each of the plurality of connection layers may have a width equal to a width of a second region under the at least one light emitting cell of the first unit, and may extend across and under a first region under the gap part between the first and second light emitting parts. Alternatively, the width of each of the plurality of connection layers in the first region under the gap part may equal to or larger than a width thereof in the second region under the at least one light emitting cells of the first light emitting part. The first light emitting part may include the at least one light emitting cells, and the second light emitting part may include the plurality of light emitting cells.

Referring to FIG. 4, the second gap part 132 may be disposed between the first row of at least one light emitting cells and the second row of at least two light emitting cells 123 and 124. The plurality of connection layers 36A, 37A may have the same width in a region under the second gap part 132. That is, each of the connection layers 36A, 37A may have a width equal to or larger than a width of a region of each of the light emitting cells 121, 122. Each of the connection layers 36A, 37A may extend across and under the second gap part 131. In this connection, when the first row has one light emitting cell, the first gap part may be removed.

As shown in FIG. 4 and FIG. 7, one among the plurality of connection layers 36A, 37A, for example, the second connection layer 37A may extend partially under and across the third light emitting cell 123 and, then, may extend partially under and across the third gap part 133, and, then, may extend partially under and across the fourth light emitting cells 124. In this connection, a width of the second connection layer 37A under a third region under the third light emitting cell 123 may not be reduced. That is, the second connection layer 37A may extend across and under the fourth region under the third gap part 133 with a width equal to or larger than a width thereof in the third region under the third light emitting cell 123. The second connection layer 37A may be electrically insulated from the fourth light emitting cell 124. The second connection layer 37A may have the first region under the first light emitting cell 122, the second region under a portion of the second gap part 132, the third region under a portion of the third light emitting cell 123, and the fourth region under a portion of the third gap part 133.

Each of the light emitting cells 121, 122, 123 and 124 will be descried in details. The light emitting structure 10 may include a first semiconductor layer 11, an active layer 12, and a second semiconductor layer 13. The active layer 12 may be disposed between the first semiconductor layer 11 and the second semiconductor layer 13. The active layer 12 may be disposed under the first semiconductor layer 11. The second semiconductor layer 13 may be disposed under the active layer 12.

For example, the first semiconductor layer 11 may include an n-type semiconductor layer doped with a first conductive-type dopant, for example, an n-type dopant. The second semiconductor layer 13 may include a p-type semiconductor layer doped with a second conductive-type dopant, for example, a p-type dopant. In another example, the first semiconductor layer 11 may include a p-type semiconductor layer doped with a first conductive-type dopant, for example, a p-type dopant. The second semiconductor layer 13 may include an n-type semiconductor layer doped with a second conductive-type dopant, for example, an n-type dopant.

The first semiconductor layer 11 may include, for example, an n-type semiconductor layer. The first semiconductor layer 11 may include a compound semiconductor. The first semiconductor layer 11 may include, for example, at least one of an II-VI group compound semiconductor, and III-V group compound semiconductor.

For example, the first semiconductor layer 11 may include a semiconductor material with a composition of $In_xAl_yGa_{1-x-y}N$, wherein $0 \leq x \leq 1$, $0 \leq y \leq 1$, $0 \leq x+y \leq 1$. The first semiconductor layer 11 may include, for example, at least one selected from a group consisting of GaN, AlN, AlGaN, InGaN, InN, InAlGaN, AlInN, AlGaAs, GaP, GaAs, GaAsP, AlGaInP, etc. Further, Si, Ge, Sn, Se, Te, etc. as an n-type dopant may be doped into the first semiconductor layer. The first semiconductor layer 11 may have an unevenness 11A at top face thereof. The unevenness 11A may improve light extraction.

The active layer 12 may refer to a layer in which an electron (or hole) injected from the first semiconductor layer 11 encounters a hole (or electron) injected from the second semiconductor layer 13, thereby to emit light based on an energy band of a material of the active layer 12. The active layer 12 may include any one of a single quantum well, a multi quantum well, a quantum dot, or a quantum wire. However, the present disclosure is not limited thereto.

The active layer 12 may include a compound semiconductor. The active layer 12 may include, for example, at least one of II-VI group and III-V group compound semiconductors. The active layer 12 may include a semiconductor material with a composition of, for example, $In_xAl_yGa_{1-x-y}N$, wherein $0 \leq x \leq 1$, $0 \leq y \leq 1$, $0 \leq x+y \leq 1$. When the active layer 12 may include a multi quantum well, the active layer 12 may be embodied as vertical alternations of a plurality of well layers and a plurality of barrier layers. For example, a pair of a well layer/barrier layer may include InGaN well layer/GaN barrier layer. InGaN well layer/AlGaN barrier layer, InAlGaN well layer/InAlGaN barrier layer, or GaN well layer/AlGaN barrier layer.

The second semiconductor layer 13 may include, for example, p-type semiconductor layer. The second semiconductor layer 13 may include a compound semiconductor. The second semiconductor layer 13 may include, for example, at least one of II-VI group and III-V group compound semiconductors.

For example, the second semiconductor layer 13 may include a semiconductor material with a composition of $In_xAl_yGa_{1-x-y}N$, wherein $0 \leq x \leq 1$, $0 \leq y \leq 1$, $0 \leq x+y \leq 1$. The second semiconductor layer 13 may include, for example, at least one selected from a group consisting of GaN, AlN, AlGaN, InGaN, InN, InAlGaN, AlInN, AlGaAs, GaP, GaAs, GaAsP, AlGaInP, etc. Mg, Zn, Ca, Sr, Ba, etc. as a p-type dopant may be doped into the second semiconductor layer 13.

In another example, the first semiconductor layer 11 may include a p-type semiconductor layer, and the second semiconductor layer 13 may include an n-type semiconductor layer. In another example, under the second semiconductor layer 13, a further semiconductor layer may be disposed to have a different conductive-type from that of the second semiconductor layer 13. In this way, the light emitting structure 10 may be formed of at least one of NP, PN, NPN, and PNP junctions. Impurities doping concentrations in the first semiconductor layer 11 and the second semiconductor layer 13 may be uniform or non-uniform. That is, the light emitting structure 10 may be various. Thus, the present disclosure is not limited thereto.

Further, between the first semiconductor layer 11 and the active layer 12 or between the second semiconductor layer 13 and the active layer 12, for example, InGaN/GaN super lattice structure or InGaN/InGaN super lattice structure may be formed. Further, between the second semiconductor layer 13 and the active layer 12, an AlGaN layer doped with a second conductive-type dopant may be formed.

The first semiconductor layer 11 may have a roughness 11A formed at the top thereof. The roughness 11A may improve the light extraction efficiency.

The first semiconductor layer 11 may a protrusion 16. The protrusion 16 may be plural. The plural protrusions 16 may be spaced with each other. The roughness 11A may be formed on the protrusion 16 at the top thereof. However, the present disclosure is not limited thereto. The protrusion 16 may be formed of a first conductive-type semiconductor layer or an un-doped semiconductor layer. However, the present disclosure is not limited thereto. The un-doped semiconductor layer may have an interface with the first semiconductor layer 11 and may be formed of a semiconductor layer having a conductance lower than that of the first semiconductor layer 11. Alternatively, the un-doped semiconductor layer may be formed on the first semiconductor layer 11 using an ion implant process. However, the present disclosure is not limited thereto.

The first electrode layer 82 may be disposed between the light emitting structure 10 and the second electrode layer 83. The first electrode layer 82 may be electrically connected to the second semiconductor layer 13, and may be electrically insulated from the second electrode layer 83. The first electrode layer 82 may include a first contact layer 15, a reflection layer 17 and a first capping layer 35. The first contact layer 15 may be disposed between the reflection layer 17 and the second semiconductor layer 13. The reflection layer 17 may be disposed between the first contact layer 15 and the first capping layer 35. The first contact layer 15, reflection layer 17 and first capping layer 35 may include different conductive materials. However, the present disclosure is not limited thereto.

The first contact layer 15 may contact, for example, ohmic-contact the second semiconductor layer 13. The first contact layer 15 may include, for example, a conductive oxide film, a conductive nitride or metal. The contact layer 15 may include, for example, at least one selected from a group consisting of ITO (Indium Tin Oxide), ITON (ITO Nitride), IZO (Indium Zinc Oxide), IZON (IZO Nitride), AZO (Aluminum Zinc Oxide), AGZO (Aluminum Gallium Zinc Oxide), IZTO (Indium Zinc Tin Oxide), IAZO (Indium Aluminum Zinc Oxide), IGZO (Indium Gallium Zinc Oxide), IGTO (Indium Gallium Tin Oxide), ATO (Antimony Tin Oxide), GZO (Gallium Zinc Oxide), IZON (IZO Nitride), ZnO, IrOx, RuOx, and NiO, Pt, Ag, and Ti.

The reflection layer 17 may be electrically connected to the first contact layer 15 and first capping layer 35. The reflection layer 17 may act to reflect light incident from the light emitting structure 10 to increase a light level toward the outside of the present light emitting device.

The reflection layer 17 may include a metal having a light reflection rate equal to or higher than 70%. For example, the reflection layer 17 may include a metal or alloy thereof, for example, at least one selected from a group consisting of Ag, Ni, Al, Rh, Pd, Ir, Ru, Mg, Zn, Pt, Cu, Au, and Hf. Further, the reflection layer 17 may be formed of a stack of a first layer of the metal or alloy thereof and a second layer includes a light-transparent conductive material such as ITO (Indium-Tin-Oxide), IZO (Indium-Zinc-Oxide), IZTO (Indium-Zinc-Tin-Oxide), IAZO (Indium-Aluminum-Zinc-Oxide), IGZO (Indium-Gallium-Zinc-Oxide), IGTO (Indium-Gallium-Tin-Oxide), AZO (Aluminum-Zinc-Oxide), ATO (Antimony-Tin-Oxide), etc. For example, in an embodiment, the reflection layer 17 may include at least one selected from a group consisting of Ag, Al, Ag—Pd—Cu alloy, or Ag—Cu alloy thereof. For example, the reflection layer 17 may be formed of a stack of an Ag layer and Ni layer, a stack of Ni/Ag/Ni layers or may be formed of a Ti layer or a Pt layer. In another example, the first contact layer 15 may be formed under the reflection layer 17, and may at least partially pass through the reflection layer 17 to contact the second semiconductor layer 13. In another example, the reflection layer 17 may be disposed under the first contact layer 15 and may at least partially pass through the first contact layer 15 to contact the second semiconductor layer 13.

In one embodiment, the light emitting device may include the first capping layer 35 under the reflection layer 17. The first capping layer 35 may contact the reflection layer 17 on the bottom face thereof. The first capping layer 35 may be electrically connected to the first to fourth pads 111, 112, 113 and 114 of each of the light emitting cells 121, 122, 123 and 124. The first capping layer 35 may include, a metal, for example, at least one of Au, Cu. Ni, Ti, Ti—W, Cr, W, Pt, V. Fe, and Mo. The first capping layer 35 may have a thickness of 300 to 700 nm range. When the thickness of the first capping layer 35 is smaller than the above-defined range, a current spreading may be deteriorated. When the thickness of the first capping layer 35 is larger than the above-defined range, the current spreading effect may slightly increase but may cause the light emitting device to be thicker. The first capping layer 35 may protect the reflection layer 17 and may act to receive a power from the first to fourth pads 111, 112, 113 and 114 of the first light emitting device 100.

Each of the pads 111, 112, 113 and 114 of the first light emitting device 100 may be formed of a single or multiple layers. Each of the pads 111, 112, 113 and 114 may include at least one of Ti, Ag, Cu, and Au. For example, when each of the pads 111, 112, 113 and 114 may be formed of multiple layers, the pad may include a stack of Ti/Ag/Cu/Au or a stack of Ti/Cu/Au. However, the present disclosure may not be limited thereto.

The protective layer 30 may be disposed under the light emitting structure 10. The protective layer 30 may contact the second semiconductor layer 13 on a bottom face thereof and contact the first contact layer 15, and contact the reflection layer 17.

The protective layer 30 may have an inner protective layer vertically overlapping the light emitting structure 10, and an outer protective layer extending outwardly beyond the side wall of the light emitting structure 10.

The protective layer 30 may have the inner protective layer disposed between the light emitting structure 10 and the first electrode layer 82. The outer protective layer thereof may be disposed between the light extraction layer 95 and the first insulating layer 41. The outer protective layer of the protective layer 30 may extend outwardly beyond the side wall of the light emitting structure 10, thereby to prevent a moisture from entering the light emitting structure 10. The outer protective layer of the protective layer 30 may protect the light emitting structure 10 from a shock transferred to a chip during an etching process. Further, the protective layer 30 may act as an etching stopper in an isolation process for each light emitting structure 10. Further, the protective layer 30 may act to suppress the deterioration of the electrical property of the light emitting device due to the isolation process. The light extraction layer 95 may include a material having a refractive index between refractive indexes of the light emitting structure 10 material and air. The light extraction layer 95 may effectively extract the light from the light emitting structure 10.

The protective layer 30 may be defined as a channel layer, or a low-refractive material isolation layer. The protective layer 30 may include an insulating material, for example, an oxide or nitride. For example, the protective layer 30 may include at least one selected from a group consisting of $SiO_2$, $Si_xO_y$, $Si_3N_4$, $Si_xN_y$, $SiO_xN_y$, $Al_2O_3$, $TiO_2$, AlN, etc. The protective layer 30 may include a transparent material. However, the present disclosure is not limited thereto.

In one embodiment, the light emitting device may include the first insulating layer 41 to allow electrical insulation between the first electrode layer 82 and the second electrode layer 83. The first insulating layer 41 may be disposed between the first electrode layer 82 and the second electrode layer 83. The first insulating layer 41 may contact, at a top face thereof, the protective layer 30. The first insulating layer 41 may vertically overlap the protrusion 16 of the light emitting structure 10.

The first insulating layer 41 may include, for example, an oxide or nitride. For example, the first insulating layer 41 may include at least one selected from a group consisting of $SiO_2$, $Si_xO_y$, $Si_3N_4$, $Si_xN_y$, $SiO_xN_y$, $Al_2O_3$, $TiO_2$, AlN, etc.

The first insulating layer 41 may have a thickness of, for example, 100 nanometer to 2000 nanometer. When the thickness of the first insulating layer 41 is under 100 nanometer, the insulating property may be deteriorated. To the contrary, when the thickness of the first insulating layer 41 exceeds 2000 nanometer, there may occur a fracture therein for a post-process. The first insulating layer 41 may contact the first electrode layer 82 on the bottom face thereof. The second insulating layer 43 may contact the second electrode layer 83 on the top face thereof. At least one of the first and second insulating layers 41, 43 may be thicker than each of the protective layer 30, the first capping layer 35, the first contact layer 15, and the reflection layer 17. However, the present disclosure is not limited thereto.

The second electrode layer 83 may be disposed under the plurality of light emitting cells 121, 122, 123 and 124. The second electrode layer 83 may include a diffusion inhibition layer 50 disposed under the second insulating layer 43, a bonding layer 60 disposed under the diffusion inhibition layer 50, and the conductive support 70 disposed under the bonding layer 60. The second electrode layer 83 may be electrically connected to the first semiconductor layer 11. Further, the second electrode layer 83 may selectively include one or two of the diffusion inhibition layer 50, the bonding layer 60, and the conductive support 70. It may dispense with at least one of the diffusion inhibition layer 50 or the bonding layer 60.

The diffusion inhibition layer 50 may include at least one selected from a group consisting of Cu, Ni, Ti, Ti—W, Cr, W, Pt, V, Fe, and Mo. The diffusion inhibition layer 50 may act as a diffusion barrier layer between the second insulating layer 43 and bonding layer 60. The diffusion inhibition layer 50 may be electrically connected to the bonding layer 60 and conductive support 70, and, thus, may be electrically connected to the first semiconductor layer 11.

The diffusion inhibition layer 50 may function to prevent the material contained in the bonding layer 60 from diffusing toward the reflection layer 17 for formation of the bonding layer 60. Specifically, the diffusion inhibition layer 50 may function to prevent tin (Sn), etc. contained in the bonding layer 60 from diffusing toward the reflection layer 17.

The bonding layer 60 may include a barrier metal or bonding metal etc. The bonding layer 60 may include at least one selected from a group consisting of, for example, Ti, Au, Sn, Ni, Cr, Ga, In, Bi, Cu, Ag, Nb, Pd or Ta. The conductive support 70 may support the light emitting structure 10 and perform heat-dissipation. The bonding layer 60 may include a seed layer.

The conductive support 70 may include a metal or carrier substrate. The conductive support 70 may include at least one selected from a group consisting of, for example, Ti, Cr, Ni, Al, Pt, Au, W. Cu, Mo, or Cu—W. In another example, the conductive support 70 may be embodied as an impurities-doped semiconductor substrate (e.g., Si, Ge, GaN, GaAs, ZnO, SiC, SiGe, etc. substrate). The conductive support 70 may act to support the first light emitting device 100. For this, the thickness thereof may be equal to or larger than 80% of a thickness of the second electrode layer 83. For example, the thickness thereof may be larger than or equal to 30 μm. When the thickness of the conductive support 70 is under 30 μm, the conductive support 70 may be poor at supporting the first light emitting device 100 and/or may have the deteriorated heat-dissipation.

The second contact layer 141 may be disposed in the first semiconductor layer 11 and contact the first semiconductor layer 11. The second contact layer 141 may have a top level higher than a bottom level of the first semiconductor layer 11. The second contact layer 141 may be electrically connected to the first semiconductor layer 11 and second electrode layer 83, but may be electrically insulated from the active layer 12 and second semiconductor layer 13. The second contact layer 141 may be plural in each of the light emitting cells 121, 122, 123 and 124. The second contact layer 141 may not vertically overlap the first and second connection layer 36A, 37A and the second and third capping layers 36, 37 in each of the first to fourth light emitting cells 121, 122, 123 and 124.

The second contact layer 141 may be electrically connected to the second electrode layer 83. The second contact layer 141 may pass through the first electrode layer 82, the active layer 12 and the second semiconductor layer 13. The second contact layer 141 may be disposed in a recess 3 defined in the light emitting structure 10. A third insulating layer 45 may be formed in the recess 3 so as to electrically isolate the second contact layer 141 from the active layer 12 and second semiconductor layer 13. The second contact layer 141 may be plural. The plurality of the second contact layers 141 may be spaced from each other. Each of the second contact layers 141 may vertically overlap the protrusion 16. The third insulating layer 45 may surround the second contact layer 141 in the recess 3. The third insulating layer 45 may be embodied as a further extension of at least one of the protective layer 30 and first insulating layer 41. However, the present disclosure is not limited thereto.

The second contact layer 141 may be connected to an extension portion 61 of the second electrode layer 83. The extension portion 61 may extend upwards from the diffusion inhibition layer 50. The extension portion 61 may pass through the first insulating layer 41 and through a hole 2 defined in the protective layer 30. The extension portion 61 may be electrically insulated from the first electrode layer 82. In another example, the extension portion 61 may extend upwards from the bonding layer 60. However, the present disclosure is not limited thereto.

The second contact layer 141 may include at least one selected from a group consisting of, for example, Cr, V, W, Ti, Zn, Ni, Cu, Al, Au, and Mo. The extension portion 61 may include at least one of materials contained in the diffusion inhibition layer 50. However, the present disclosure is not limited thereto. For example, the extension portion 61 may include at least one selected from a group consisting of, for example, Ti, Au, Sn, Ni, Cr, Ga, In, Bi, Cu, Ag, Nb, Pd or Ta.

The light extraction layer 95 may protect a surface of the light emitting structure 10, and may contact the protective layer 30 on a perimeter region thereof. The light extraction layer 95 may have a refractive index lower than the refractive index of a semiconductor layer material of the light emitting structure 10, thereby to improve light extraction efficiency. The light extraction layer 95 may include, for example, an oxide or nitride. For example, the light extraction layer 95 may include at least one selected from a group consisting of, for example, $SiO_2$, $Si_xO_y$, $Si_3N_4$, $Si_xN_y$, $SiO_xN_y$, $Al_2O_3$, $TiO_2$, AlN, etc. In another example, it may dispense with the light extraction layer 95. The light extraction layer 95 may be referred to as a lower refractive index layer having a refractive index lower than that of the semiconductor layer, or a protective layer to protect a surface of the light emitting structure 10, or an insulating layer to insulate the light emitting structure 10, or a light-transmitting layer to transmit the light from the light emitting structure 10 therethrough. However, the present disclosure is not limited thereto. In one embodiment, the light emitting structure 10 may be driven using the first electrode layer 82 and the second electrode layer 83.

As shown in FIG. 5, between the first electrode layer 82 and the second electrode layer 83 of the first light emitting cells 121, the first connection layer 36A may be disposed. The first connection layer 36A may be connected to the third pad 113 as shown FIG. 4 and may extend to a second capping layer 36 as shown in FIG. 7. The first connection layer 36A may be disposed between the first insulating layer 41 and the second insulating layer 43. The first connection layer 36A may be electrically insulated from the second electrode layer 83 and the first electrode layer 82 of the first light emitting cells 121. The first connection layer 36A may extend under and across the first light emitting cell 121 and then extend under and to the second capping layer 36 of the third light emitting cell 123.

As shown in FIG. 6 to FIG. 9, between the first electrode layer 82 and the second electrode layer 83 of each of the second and third light emitting cells 122, 123, the second connection layer 37A may be disposed. The second connection layer 37A may be connected to the fourth pad 114 as shown in FIG. 4 and may extend to a third capping layer 37 as shown in FIG. 6 to FIG. 9. The second connection layer 37A may be disposed between the first insulating layer 41 and second insulating layer 43 of each of the second and third light emitting cells 121, 123. The second connection layer 37A may be electrically insulated from the second electrode layer 83 and the first electrode layer 82 of each of the second and third light emitting cells 122, 123. The second connection layer 37A may extend across and under the second and third light emitting cells 122, 123 as shown in FIG. 6 to FIG. 9 and then extend under and to the third capping layer 37 of the fourth light emitting cell 124.

In this way, the third light emitting cell 123 in FIG. 4 may contact the first and second capping layers 35, 36 under the first region A1 a shown in FIG. 7 and may be spaced from the first capping layer 35 and second connection layer 37A in the third region A3 as shown in FIG. 7. The second capping layer 36 may not be disposed under the first capping layer 35 in the second region A2. Further, the third region A3 of the third light emitting cell 123 may be disposed between the first and second regions A1, A2. The third region A3 of the third light emitting cell 123 may not vertically overlap the second capping layer 36 and second connection layer 37A. Thus, the third region A3 of the third light emitting cell 123 may act to supply a power via the first capping layer 35.

As shown in FIG. 8 and FIG. 9, under the fourth light emitting cell 124, the third capping layer 37 may be disposed to contact the first capping layer 35. The third capping layer 37 may contact the first capping layer 35 on the bottom face thereof, thereby to supply the power thereto. A portion 34 of the second connection layer 37A may extend under and to the fourth pad 114.

Each of the second and third capping layers 36, 37 may include a metal, for example, the same metal as the first capping layer 35. For example, Each of the second and third capping layers 36, 37 may include at least one selected from a group consisting of, for example, Au, Cu, Ni, Ti, Ti—W, Cr, W, Pt, V, Fe, and Mo. Each of the second and third capping layers 36, 37 may have a thickness of 300 to 700 nm range. When the thickness of each of the second and third capping layers 36, 37 is smaller than the above-defined range, a current spreading may be deteriorated. When the thickness of each of the second and third capping layers 36, 37 is larger than the above-defined range, the current spreading effect may slightly increase but may cause the light emitting device to be thicker. The second and third capping layers 36, 37 may be disposed under the third and fourth light emitting cells 123 and 124 respectively. Each of the second and third capping layers 36, 37 may contact the first capping layer 35 on the bottom face thereof, thereby to supply the power via the first and second connection layers 36A, 37A respectively.

Each of the first and second connection layers 36A, 37A may include a metal, for example, the same metal as the second and third capping layers 36, 37. For example, each of the first and second connection layers 36A, 37A may include at least one selected from a group consisting of, for example, Au, Cu, Ni, Ti, Ti—W, Cr, W, Pt, V, Fe, and Mo. Each of the first and second connection layers 36A, 37A may have a thickness of 300 to 700 nm range. When the thickness of each of the second and third connection layers 36A, 37A is smaller than the above-defined range, a current spreading may be deteriorated. When the thickness of each of the second and third connection layers 36A, 37A is larger than the above-defined range, the current spreading effect may slightly increase but may cause the light emitting device to be thicker.

In this way, in the first light emitting device 100, the double capping layers may be disposed under each of the third and fourth light emitting cells 123 and 124 in each region spaced from the first to fourth pads 111, 112, 113 and 114. The double capping layers may allow the reduction of the difference between the operation voltages of the third and third light emitting cells 123 and 124 due to the distance difference. Further, the double capping layers may allow the reduction of the difference between the widths between the first and second connection layers 36A, 37A, thereby to reduce the difference between the operation voltages applied to the first capping layers 35 disposed under the third and fourth light emitting cells 123 and 124 respectively. In another example, each of the second and third capping layers 36, 37 and the first and second connection layers 36A, 37A may include a different metal from a metal of the first capping layer 35. In another example, each of the second and third capping layers 36, 37 and the first and second connection layers 36A, 37A may include a metal having a conductance higher than that of the metal material of the first capping layer 35. This may allow a reduction of the difference between the operation voltages of the fourth light emitting cell 124 and third light emitting cell 123 due to the fact that the fourth light emitting cell 124 is more spaced from the fourth pad 114 than the third light emitting cell 123 is spaced. Further, the second capping layer 36 may be monolithic with the first connection layer 36A. In an alternative, the second capping layer 36 may include a different metal from the first connection layer 36A. Further, the third capping layer 37 may be monolithic with the second connection layer 37A. In an alternative, the third capping layer 37 may include a different metal from the second connection layer 37A.

The second insulating layer 43 may have a thickness of, for example, 100 nanometer to 2000 nanometer. When the thickness of the second insulating layer 43 is under 100 nanometer, the insulating property may be deteriorated. To the contrary, when the thickness of the second insulating layer 43 exceeds 2000 nanometer, the insulating between the first and second connection layers 36A, 37A may be deteriorated.

FIG. 10 illustrates an example of differences between the operation voltages of light emitting cells of a light emitting device in a conventional approach. When a current I1 fed to the first to fourth light emitting cells as shown in FIG. 4 is small, difference between the operation voltages of the first and second light emitting cells and the third and fourth light emitting cells may be small. When a current I2 fed to the first to fourth light emitting cells as shown in FIG. 4 is larger, a difference between the operation voltages of first and second light emitting cells and the third and fourth light emitting cells may be large. At the latter case, the difference between the operation voltages of the third and fourth light emitting cells as shown in FIG. 10 may be larger than 0.2V. In this comparison example, three samples (SPLs) of the light emitting device may be tested. This comparison example as the conventional approach may not include the second capping layer in the first light emitting device as shown in FIG. 4, and, hence, may have a difference above 50% in between widths the first and second connection layers.

To the contrary, FIG. 11 illustrates an example of differences between the operation voltages of light emitting cells of a light emitting device in a present approach. As shown in FIG. 11, the difference between the operation voltages of the third and fourth light emitting cells may be smaller than the difference between the operation voltages of the third and fourth light emitting cells as shown in FIG. 10. Even when the current I2 fed to the first to fourth light emitting cells as shown in FIG. 4 is larger, the difference between the operation voltages of the third and fourth light emitting cells as shown in FIG. 11 may be smaller than 0.1V. That is, the difference between the operation voltages of the third and fourth light emitting cells in the present approach may be reduced to a level under 50% of the difference between the operation voltages of the third and fourth light emitting cells in the conventional approach. Thus, the electrical reliabilities of third and fourth light emitting cells of each light emitting device may be improved.

In one embodiment, each light emitting device may include a plurality of light emitting cells which may be driven individually. Although the above description refers to the situation where one light emitting device includes four light emitting cells, the present disclosure may not be limited thereto. For example, one light emitting device may include five or six or more light emitting cells which may be driven individually. The present light emitting device may be employed, for example, for a vehicle illumination, for example, a front or rear lamp.

Further, in one embodiment, the light emitting device may include at least one of a fluorescent layer (not shown) and a lens on a top face thereof. The fluorescent layer may have a uniform thickness using, for example, a conformal coating. However, the present disclosure is not limited thereto. Further, each light emitting device may be packaged using a molding member.

In one embodiment, the light emitting device may have various optics, for example, a lens, a light guide plate, a prism sheet, a diffusion sheet, etc. in a light path. The light emitting device, substrate, and optics may collectively form a lighting unit. This lighting unit may be implemented as a top view or side view type and may be incorporated in a display of a portable device such as a notebook, or may be applied to an illumination device or indication device, etc.

In another embodiment, the above-disclosed lighting unit or a package thereof may be implemented as an illumination device. For example, the above-disclosed lighting unit or a package thereof may be implemented as a lamp, street light, electric signboard, headlight, etc. In one embodiment, the above-disclosed lighting unit or a package thereof may be implemented for a vehicle illumination, for example, as a front or rear lamp.

Example embodiments have been described in more detail with reference to the accompanying drawings. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art.

Examples of various embodiments are illustrated and described further under. It will be understood that the description herein is not intended to limit the claims to the specific embodiments described. On the contrary, it is intended to cover alternatives, modifications, and equivalents as may be included within the spirit and scope of the present disclosure as defined by the appended claims.

INDUSTRIAL APPLICABILITY

The above embodiments may improve reliability of light emitting device.

The light emitting devices of the above embodiments may be used as an illumination device, for example, a lamp, street light, electric signboard, headlight, etc. including the LED.

What is claimed is:

1. A light emitting device comprising:
   a first light emitting part including a first light emitting cell and a second light emitting cell spaced apart from each other in a first direction;
   a second light emitting part including a third light emitting cell and a fourth light emitting cell spaced part from each other in a second direction, wherein each of the first to fourth light emitting cells include a light emitting structure and a first electrode layer disposed under the light emitting structure;
   a first pad and a third pad disposed on the first light emitting cell, wherein the first pad is electrically connected to the first electrode layer of the first light emitting cell and the third pad is electrically connected to the first electrode layer of the third light emitting cell;
   a second pad and a fourth pad disposed on the second light emitting cell, wherein the second pad is electrically connected to the first electrode layer of the second light emitting cell and the fourth pad is electrically connected to the first electrode layer of the fourth light emitting cell;
   a first connection layer extending from a lower region of the first light emitting cell to a lower region of the third light emitting cell;
   a second connection layer extending from a lower region of the second light emitting cell to a lower region of the fourth light emitting cell;
   a second electrode layer disposed under the first to fourth light emitting cells;
   a first insulating layer disposed between the first and second electrode layers;
   a second insulating layer disposed between the first insulating layer and the second electrode layer; and
   a gap part including a first gap part disposed between the first and second light emitting cells, a second gap part disposed between the first and second light emitting cells and the third light emitting cell, and a third gap part disposed between the third and fourth light emitting cells,
   wherein each of the first and second connection layers extends through a region under the second gap part,
   wherein the first to fourth pads are disposed on a first side of the first light emitting part,
   wherein the first to fourth pads are disposed in the first direction, wherein the first direction is a direction orthogonal to the second direction,
   wherein the first light emitting cell is disposed between the first and third pads and the third light emitting cell,
   wherein the second light emitting cell is disposed between the second and fourth pads and the fourth light emitting cell,
   wherein the third light emitting cell is spaced apart from the first and second light emitting cells in the second direction,
   wherein a first region of the third light emitting cell is disposed between the first light emitting cell and the fourth light emitting cell and is spaced apart from the first light emitting cell in the second direction,
   wherein a second region of the third light emitting cell is disposed between the second light emitting cell and the fourth light emitting cell and is spaced apart from the second light emitting cell in the second direction, and
   wherein the light emitting structure includes:
      a first semiconductor layer electrically connected to the second electrode layer;
      an active layer disposed under the first semiconductor layer; and
      a second semiconductor layer disposed under the active layer and electrically connected to the first electrode layer.

2. The device of claim 1, wherein a number of light emitting cells of the first light emitting part is equal to a number of light emitting cells of the second light emitting part.

3. The device of claim 2, wherein a width of each of the first and second connection layers under the second gap part is larger than a width of each of the first connection layer under the first light emitting cell and the second connection layer under the second light emitting cell in the first direction.

4. The device of claim 1, wherein the first electrode layer of each of the first to fourth light emitting cells includes a first contact layer, a reflective layer under the first contact layer and a first capping layer under the reflective layer,
   wherein the first contact layer is disposed between the reflective layer and the second semiconductor layer,
   wherein the reflective layer is disposed between the first contact layer and the first capping layer,
   wherein the first contact layer is disposed between the reflective layer and the second semiconductor layer,
   wherein the third light emitting cell includes a second capping layer disposed under the first electrode layer,
   wherein the fourth light emitting cell includes a third capping layer disposed under the first electrode layer,
   wherein the first connection layer extends under and across the second gap part and extends to the second capping layer, and
   wherein the second connection layer extends under and across the second gap part and the second region of the third light emitting cell and extends to the third capping layer.

5. The device of claim 4, wherein each of the first and second light emitting cells has a first length in the first direction, and
   wherein each of the third and fourth light emitting cells has a maximum length larger than the first length in the first direction.

6. The device of claim 4,
   wherein the first connection layer is electrically connected to the third light emitting cell and is electrically insulated from the first electrode layer of the first light emitting cell, and
   wherein the second connection layer is electrically connected to the fourth light emitting cell and is electrically insulated from the second light emitting cell, and
   wherein the first and second connection layers are electrically insulated from the first electrode layer of each of the first and second light emitting cells and the second electrode layer.

7. The device of claim 6,
   wherein the first pad disposed on the first light emitting cell is electrically connected to the first electrode layer of the first light emitting cell,
   wherein the third pad is disposed on an outer portion of the first connection layer and is electrically connected to the first connection layer,
   wherein the second pad disposed on the second light emitting cell is electrically connected to the first electrode layer of the second light emitting cell, and
   wherein the fourth pad disposed on an outer portion of the second connection layer is electrically connected to the second connection layer.

8. The device of claim 4,
   wherein the second capping layer is disposed under the first capping layer of the third light emitting cell and electrically connected to the first connection layer and the third pad, and
   wherein the third capping layer is disposed under the first capping layer of the fourth light emitting cell and is electrically connected to the second connection layer and the fourth pad.

9. The device of claim 6, wherein the first connection layer and the second connection layer are disposed under a lower region of the third light emitting cell, and
   wherein the first and second connection layers have the same width from each other in the lower region of the third light emitting cell in the first direction.

10. The device of claim 5, wherein a length of the third light emitting cell in the first direction is gradually decreased in a direction going away from the first to fourth pads, and
    wherein a length of the fourth light emitting cell in the first direction is gradually increased in a direction going away from the first to fourth pads.

11. The device of claim 4, wherein the second electrode layer is commonly electrically connected to the first to fourth light emitting cells of the first and second light emitting parts.

12. The device of claim 6, wherein the second electrode layer includes:
    a diffusion inhibition layer disposed under the second insulating layer;
    a bonding layer disposed under the diffusion inhibition layer; and
    a conductive support disposed under the bonding layer, and
    wherein the second electrode layer is commonly electrically connected to the first semiconductor layer of the light emitting structure of the first to fourth light emitting cells.

13. The device of claim 12,
    further comprising a second contact layer electrically connected to the first semiconductor layer and the second electrode layer, and partially formed in the first semiconductor layer.

14. The device of claim 13, wherein the second contact layer is disposed in each of the first to fourth light emitting cells of the first and second light emitting parts.

15. The device of claim 14, wherein the second contact layer is not vertically overlapped with the first and second connection layers.

16. A light emitting device comprising:
    a first light emitting part including a first light emitting cell and a second light emitting cell spaced apart from each other in a first direction;
    a second light emitting part including a third light emitting cell and a fourth light emitting cell spaced apart from each other in a second direction which is orthogonal to the first direction, wherein the third and fourth light emitting cells overlap with the first and second light emitting cells in the second direction;
    a plurality of pads disposed on the first and second light emitting cells and electrically connected to the first to fourth light emitting cells respectively;
    a first insulating layer disposed under the first to fourth light emitting cells;
    a second insulating layer disposed under the first insulating layer;
    a diffusion inhibition layer disposed under the second insulating layer;
    a bonding layer disposed under the diffusion inhibition layer;
    a conductive support disposed under the bonding layer;
    a first capping layer disposed between the first insulating layer and each of the first to fourth light emitting cells;
    a second capping layer disposed between the second insulating layer and the first capping layer in each of the third and fourth light emitting cells;
    a first connection layer disposed under the first and third light emitting cells and electrically connected to the first capping layer of the third light emitting cell; and
    a second connection layer disposed under the second and fourth light emitting cells and electrically connected to the second capping layer of the fourth light emitting cell, wherein each of the first to fourth light emitting cells includes a first semiconductor layer, an active layer disposed under the first semiconductor layer, and a second semiconductor layer disposed under the active layer, wherein the first semiconductor layer is electrically connected to the bonding layer, wherein the second semiconductor layer is electrically connected to the first capping layer of each of the first to fourth light emitting cells, wherein the third light emitting cell is disposed between the first light emitting cell and the fourth light emitting cell and between the second light emitting cell and the fourth light emitting cell in the second direction, wherein a length of the fourth light emitting cell in the first direction is gradually increased in a direction going away from the plurality of pads, wherein the first to fourth pads are disposed in the first direction, wherein the third and fourth light emitting cells have different distances from the plurality of pads, wherein a width of the first connection layer in a region between the first light emitting cell and third light emitting cell is equal to a width of the second connection layer in a region between the second light emitting cell and third light emitting cell in the first direction, wherein the plurality of pads is disposed on first sides of the first and second light emitting cells of the first light emitting part, wherein the first and second connection layers are electrically insulated from the first capping layer of each of the first and second light emitting cells and the diffusion inhibition layer, wherein each of the plurality of pads is electrically connected to the first capping layer for each of the first to fourth light emitting cells, wherein each of the first semiconductor layers of the first to fourth light emitting cells is electrically connected to the diffusion inhibition layer, and wherein the conductive support is commonly electrically connected to the first semiconductor layer of each of the first to fourth light emitting cells through the diffusion inhibition layer.

17. The device of claim 16, further comprising:
a plurality of extension portions extending from the diffusion inhibition layer toward the first semiconductor layer of each of the first to fourth light emitting cells;
a first contact layer to allow an electrical connection between each of the extension portions and each first semiconductor layer; and
a second contact layer disposed between the second semiconductor layer of each of the first to fourth light emitting cells and the first capping layer.

18. The device of claim 17, further comprising a reflection layer disposed between the first capping layer and the first contact layer.

19. The device of claim 16, wherein the plurality of pads includes:
a first pad disposed on the first light emitting cell and electrically connected to the first light emitting cell;
a second pad disposed on the second light emitting cell and electrically connected to the second light emitting cell;
a third pad disposed on the first light emitting cell and electrically connected to the first connection layer; and
a fourth pad disposed on the second light emitting cell and electrically connected to the second connection layer,
wherein an interval between the first pad and the second pad is greater than an interval between the first pad and third pad.

20. The device of claim 1, wherein an interval between the first pad and the second pad is greater than an interval between the first pad and third pad,
wherein each of the third and fourth light emitting cells has a triangular shape, and
wherein each of the third and fourth light emitting cells is overlapped with the first and second light emitting cells in the second direction.

* * * * *